(12) United States Patent
Chen et al.

(10) Patent No.: US 11,735,830 B2
(45) Date of Patent: Aug. 22, 2023

(54) ANTENNA DEVICE AND METHOD FOR MANUFACTURING THE SAME

(71) Applicant: Advanced Semiconductor Engineering, Inc., Kaohsiung (TW)

(72) Inventors: Jenchun Chen, Kaohsiung (TW); Chang-Fu Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/396,596

(22) Filed: Aug. 6, 2021

(65) Prior Publication Data

US 2023/0045587 A1 Feb. 9, 2023

(51) Int. Cl.
*H01Q 21/08* (2006.01)
*H01Q 1/40* (2006.01)
*H01Q 9/04* (2006.01)

(52) U.S. Cl.
CPC ........... *H01Q 21/08* (2013.01); *H01Q 1/40* (2013.01); *H01Q 9/0407* (2013.01); *H01L 2223/6677* (2013.01)

(58) Field of Classification Search
CPC ... H01Q 21/08; H01Q 1/40; H01L 2223/6677
See application file for complete search history.

(56) References Cited

U.S. PATENT DOCUMENTS

| | | | |
|---|---|---|---|
| 6,181,290 B1 * | 1/2001 | Zaitsev | H01Q 21/08 343/754 |
| 8,125,061 B2 | 2/2012 | Yun et al. | |
| 9,431,369 B2 * | 8/2016 | Chih | H01L 23/49827 |
| 9,859,232 B1 * | 1/2018 | Chiang | H01L 23/3121 |
| 10,651,541 B1 * | 5/2020 | Hayes | H01L 21/565 |
| 10,741,482 B2 | 8/2020 | Lee | |
| 11,081,453 B2 * | 8/2021 | Liu | H01Q 9/065 |
| 11,315,891 B2 * | 4/2022 | Tsai | H01L 24/20 |
| 2002/0149086 A1 * | 10/2002 | Aoki | H01L 23/5222 257/532 |
| 2008/0084677 A1 * | 4/2008 | Ho | H01L 25/16 361/760 |
| 2012/0193810 A1 * | 8/2012 | Tsutsumi | H01L 23/66 257/E23.145 |
| 2014/0104133 A1 * | 4/2014 | Finn | G06K 19/07769 343/866 |
| 2014/0110841 A1 * | 4/2014 | Beer | H01Q 9/16 257/738 |
| 2017/0040266 A1 * | 2/2017 | Lin | H01L 23/5385 |
| 2017/0077039 A1 * | 3/2017 | Liao | H01L 23/552 |
| 2018/0131094 A1 * | 5/2018 | Ho | H01Q 9/045 |
| 2019/0229398 A1 * | 7/2019 | Ryoo | H01L 23/66 |
| 2019/0295972 A1 * | 9/2019 | Tsai | H01L 21/4857 |
| 2020/0035625 A1 * | 1/2020 | Wang | H01L 23/3135 |
| 2020/0212536 A1 * | 7/2020 | Gupta | H01Q 1/2283 |

(Continued)

*Primary Examiner* — Jason Crawford
(74) *Attorney, Agent, or Firm* — Foley & Lardner LLP

(57) ABSTRACT

An antenna device and a method for manufacturing the same are provided. The antenna device includes a carrier and an antenna element. The carrier includes a plurality of pads and has a surface exposing the pads. The antenna element is disposed above the pads. A lateral surface of one of the pads is farther from a central axis of the antenna element substantially perpendicular to the surface than from a lateral surface of the antenna element.

4 Claims, 19 Drawing Sheets

(56) References Cited

U.S. PATENT DOCUMENTS

| | | | |
|---|---|---|---|
| 2020/0235462 A1* | 7/2020 | Tsai | H01L 21/4853 |
| 2021/0035930 A1* | 2/2021 | Chi | H01L 24/20 |
| 2021/0092836 A1* | 3/2021 | Zhang | C08G 63/605 |
| 2021/0151395 A1* | 5/2021 | Ni | H01Q 1/40 |
| 2021/0183796 A1* | 6/2021 | Vincent | H01L 23/5386 |
| 2021/0398921 A1* | 12/2021 | Chen | H01Q 1/38 |
| 2022/0181182 A1* | 6/2022 | Chen | H01L 21/6838 |
| 2022/0238405 A1* | 7/2022 | Graziosi | H01L 23/5389 |
| 2022/0262747 A1* | 8/2022 | Chiu | H01Q 9/0414 |
| 2023/0023398 A1* | 1/2023 | Chen | H01Q 1/526 |
| 2023/0045587 A1* | 2/2023 | Chen | H01Q 21/08 |
| 2023/0060538 A1* | 3/2023 | Chen | H01L 23/66 |

\* cited by examiner

ANTENNA DEVICE AND METHOD FOR MANUFACTURING THE SAME

BACKGROUND

1. Field of the Disclosure

The present disclosure relates to an antenna device and a method for manufacturing the same, and more particularly to an antenna device including an encapsulant and a method for manufacturing the same.

2. Description of the Related Art

In semiconductor device packages, one or more electronic components may be disposed on a substrate and electrically connected to the substrate through solders. However, the solders might be melted during high-temperature processes (e.g., the reflow process), and thus the electronic component may tilt relative to the substrate, which would adversely affect the electrical performance of the electronic component.

SUMMARY

In some embodiments, an antenna device includes a carrier and an antenna element. The carrier includes a plurality of pads and has a surface exposing the pads. The antenna element is disposed above the pads. A lateral surface of one of the pads is farther from a central axis of the antenna element substantially perpendicular to the surface than from a lateral surface of the antenna element.

In some embodiments, an antenna device includes a carrier, a plurality of antenna elements and an element. The carrier defines a first area and a plurality of second areas in the first area. The antenna elements are disposed on the second areas. The element includes a first portion disposed on the first area and configured to support the antenna elements and a second portion disposed on the first area configured to protect the antenna elements. The second portion is disposed around the antenna element and the first portion.

In some embodiments, a method for manufacturing an antenna device includes: (a) disposing a plurality of antenna elements on a carrier; and (b) forming an encapsulant to support the antenna elements on the carrier.

BRIEF DESCRIPTION OF THE DRAWINGS

Aspects of some embodiments of the present disclosure are readily understood from the following detailed description when read with the accompanying figures. It is noted that various structures may not necessarily be drawn to scale, and dimensions of the various structures may be arbitrarily increased or reduced for clarity of discussion.

DETAILED DESCRIPTION

Figure 1:
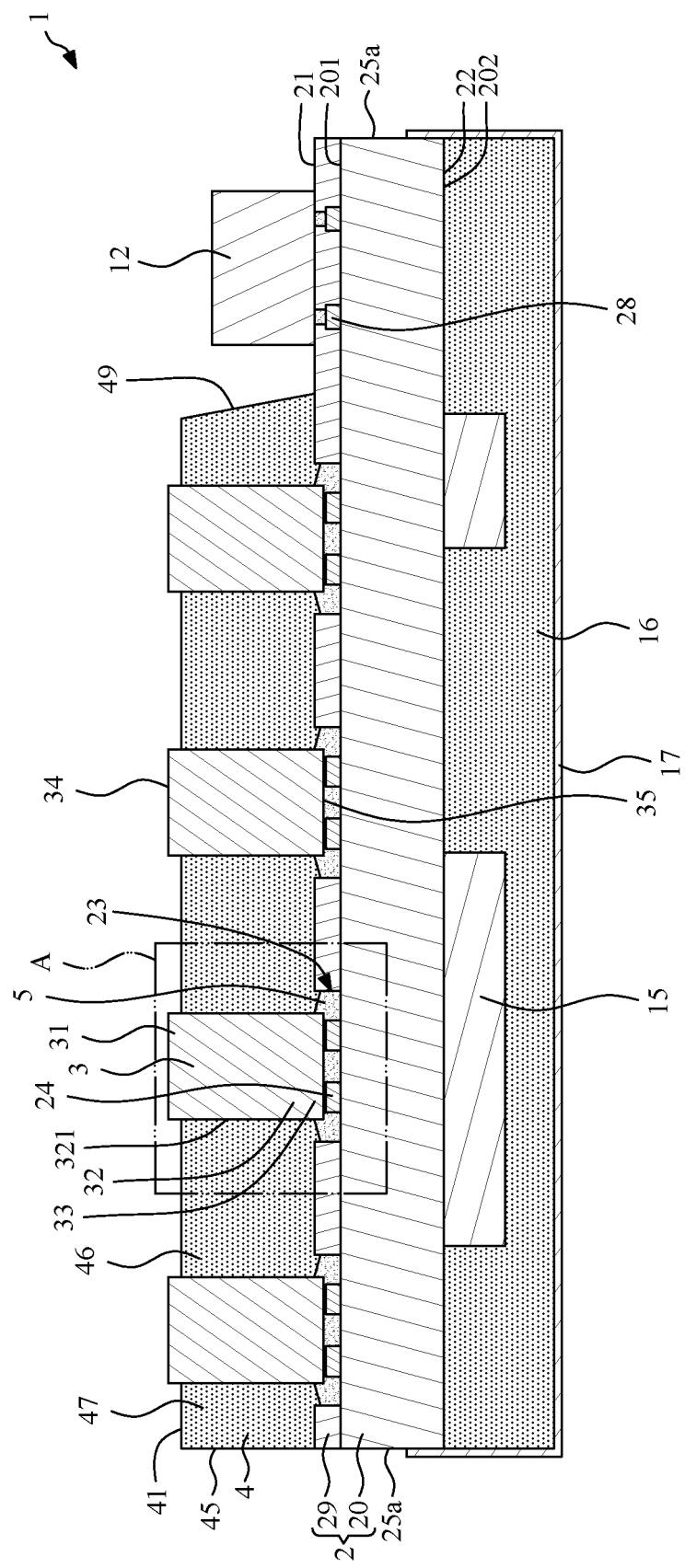
FIG. 1 illustrates a cross-sectional view of an antenna device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Figure 2:
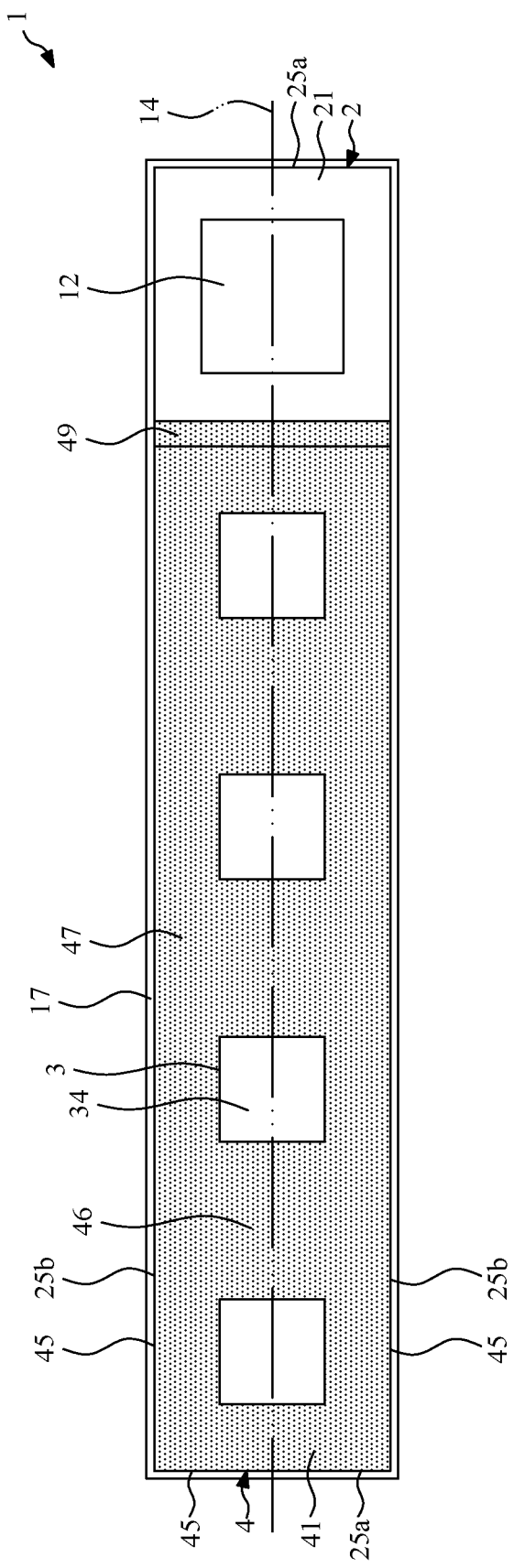
FIG. 2 illustrates a top view of the antenna device of FIG. 1.
Figure 3:
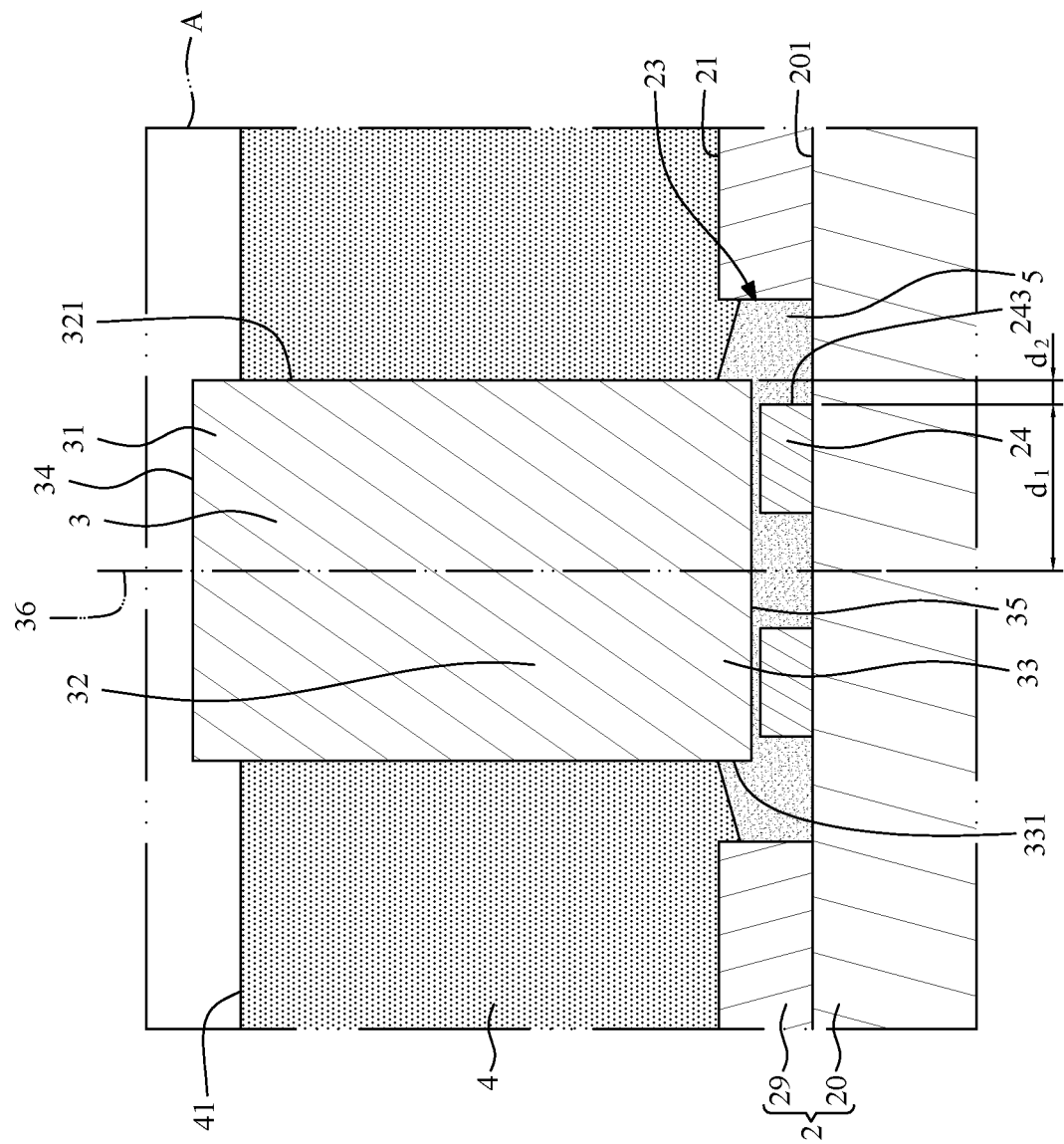
FIG. 3 illustrates an enlarged cross-sectional view of a region "A" of FIG. 1.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of an antenna device 1 according to some embodiments of the present disclosure. FIG. 2 illustrates a top view of the antenna device 1 of FIG. 1. FIG. 3 illustrates an enlarged cross-sectional view of a region "A" of FIG. 1. The antenna device 1 may include a carrier 2, at least one antenna element 3, an encapsulant 4, an adhesion material 5, a component 12, at least one electronic device 15, a package body 16 and a shielding layer 17.

The carrier 2 may be a substrate and may have a first surface 21, a second surface 22 opposite to the first surface 21, and four lateral surfaces 25a, 25b extending between the first surface 21 and the second surface 22. In some embodiments, the lateral surfaces 25a, 25b may include two opposite first lateral surfaces 25a and two opposite second lateral surfaces 25b. The carrier 2 may include a main body 20, a plurality of feeding pads 24 and a protection layer 29. The main body 20 may have a first surface 201 and a second surface 202 opposite to the first surface 201. The second surface 202 of the main body 20 may be the second surface 22 of the carrier 2. The main body 20 may include a plurality of dielectric layers and a plurality of circuit layers interposed between the dielectric layers. A material of the dielectric layers of the main body 20 may include an insulating material, a passivation material, a dielectric material or a solder resist material, such as, for example, a benzocyclobutene (BCB) based polymer, a polyimide (PI) or a polypropylene (PP). In some embodiments, the circuit layers may include at least one radio frequency (RF) routing layer and at least one antenna routing layer. The feeding pads 24 may be disposed adjacent to a first surface 201 of the main body 20 or disposed adjacent to the first surface 21 of the carrier 2. In some embodiments, the feeding pads 24 may be disposed on the first surface 201 of the main body 20 and exposed from the first surface 21 of the carrier 2. In some embodiments, the feeding pads 24 may be disposed in the main body 20 and exposed from the first surface 201 of the main body 20. The feeding pads 24 may be electrically connected to the antenna routing layer. Alternatively, the feeding pads 24 may be a portion of the antenna routing layer. The feeding pads 24 may be also referred to as "pads". The feeding pad 24 may have a lateral surface 243.

The protection layer 29 may be disposed on the first surface 201 of the main body 20, and may define a plurality of openings 23 recessed from the first surface 21 of the carrier 2. In some embodiments, the openings 23 may extend through the protection layer 29 to expose the feeding pads 24. That is, the feeding pads 24 are exposed in the opening 23. A material of the protection layer 29 may be a solder resist material. In some embodiments, the material of the protection layer 29 may be same as the material of the dielectric layers of the main body 20. In some embodiments, the protection layer 29 may be omitted. In addition, the adhesion material 5 may be disposed in the opening 23 of the protection layer 29 of the carrier 2. The adhesion material 5 may include a low dielectric constant (Dk)/low dissipation factor (Df) material.

The at least one antenna element 3 may include a plurality of antenna elements 3. The antenna elements 3 may be bonded to the first surface 21 of the carrier 2 and may be disposed above or adjacent to the feeding pads 24. In some embodiments, each of the antenna elements 3 may be a monolithic pillar structure, and the antenna elements 3 may be arranged in an array. For example, the antenna elements 3 may form a beam-forming antenna array. Further, the antenna element 3 may include a first portion 31, a second portion 32 and an end 33. The first portion 31 of the antenna element 3 may protrude or may be exposed from the encapsulant 4. The second portion 32 of the antenna element 3 may be adjacent to the carrier 2, and the first portion 31 of the antenna element 3 is far away from the carrier 2. The first portion 31 may be configured to radiate wireless signals such as radio frequency (RF) signals. Thus, the first portion 31 may be also referred to as a radiation portion. The second portion 32 of the antenna element 3 may be covered or encapsulated by the encapsulant 4. The end 33 of the antenna element 3 may extend from the second portion 32 of the antenna element 3.

As shown in FIG. 3, the end 33 of the antenna element 3 may be bonded or attached to the carrier 2 through the adhesion material 5 in the opening 23. Thus, the end 33 of the antenna element 3 may be disposed within a respective one of the openings 23. A width of the antenna element 3 may be less than a width of the openings 23. The antenna element 3 may have a first surface 34, a second surface 35 opposite to the first surface 34, and a lateral surface 321 extending between the first surface 34 and the second surface 35. The antenna element 3 may have a central axis 36 substantially perpendicular to the first surface 21 of the carrier 2 and the first surface 201 of the main body 20. The lateral surface 243 of the feeding pad 24 is farther from the central axis 36 of the antenna element 3 than from the lateral surface 321 of the antenna element 3. That is, a distance $d_1$ or a gap between the lateral surface 243 of the feeding pad 24 and the central axis 36 of the antenna element 3 is greater than a distance $d_2$ or a gap between the lateral surface 243 of the feeding pad 24 and the lateral surface 321 of the antenna element 3.

An elevation of the second surface 35 of the antenna element 3 may be lower than an elevation of the first surface 21 of the carrier 2. The feeding pads 24 may be disposed right under the antenna element 3. Thus, the antenna element 3 may cover the feeding pads 24. In some embodiments, the end 33 of the antenna element 3 does not contact the feeding pads 24. The end 33 of the antenna element 3 is spaced apart from the feeding pads 24. Alternatively, the feeding pads 24 are distance from the antenna element 3 and are configured to electrically connect to the antenna elements 3. Thus, the second surface 35 of the antenna element 3 faces the feeding pads 24, and there is a gap between the second surface 35 of the antenna element 3 and a top surface of the feeding pad 24. In some embodiments, the gap between the second surface 35 of the antenna element 3 and the top surface of the feeding pad 24 may be less than 30 μm. A portion of the adhesion material 5 may be disposed in the gap between the antenna element 3 and the feeding pad 24. Further, another portion of the adhesion material 5 may extend to cover and contact a lateral surface 331 of the end 33 of the antenna element 3.

As shown in FIG. 1 and FIG. 3, the encapsulant 4 (e.g., a molding compound with or without fillers) may cover at least a portion of the first surface 21 of the carrier 2 and encapsulate the antenna elements 3. For example, the encapsulant 4 may cover and contact a portion of the first surface 21 of the carrier 2, the entire lateral surface 321 of the second portion 32 of the antenna element 3 and the adhesion material 5. In some embodiments, the encapsulant 4 may extend into the openings 23 of the protection layer 29 of the carrier 2. In some embodiments, the adhesion material 5 may be omitted, and the encapsulant 4 may cover and contact the feeding pad 24. Further, a portion of the encapsulant 4 may be disposed in the gap between the antenna element 3 and the feeding pad 24.

The encapsulant 4 may have a first surface 41 and at least one first lateral surface 45 and a third lateral surface 49 opposite to and nonparallel with a first lateral surface 45 of the encapsulant 4. The first lateral surface 45 of the encapsulant 4 may be substantially coplanar with the first lateral surface 25a of the carrier 2. The third lateral surface 49 may be a slant surface and may expose the component 12 disposed on the carrier 2. The encapsulant 4 may not cover the first surfaces 34 of the antenna elements 3, thus, the antenna elements 3 may be exposed from the first surface 41 of the encapsulant 4. For example, the first portion 31 of the antenna element 3 may protrude from the first surface 41 of the encapsulant 4. Thus, an elevation of the first surface 34 of the antenna element 3 may be higher than an elevation of the first surface 41 of the encapsulant 4. For example, a length or a height of the antenna element 3 may be greater than a thickness of the encapsulant 4. As shown in FIG. 2, the encapsulant 4 is symmetrical with respect to a central plane 14 parallel with the second lateral surface 25b of the carrier 2.

The encapsulant 4 may be also referred to as an element that may include at least one first portion 46 and a second portion 47. The first portion(s) 46 may be located between the antenna elements 3 and may be configured to support the antenna elements 3. That is, an inner surface of the first portion 46 may contact or may be attached to the lateral surface 321 of the antenna element 3, and a bottom surface of the first portion 46 may contact or may be attached to the first surface 21 of the carrier 2. Thus, the first portion(s) 46 may be configured to secure, steady or fix the antenna elements 3 on the carrier 2. The second portion 47 may surround the antenna elements 3 and the first portion(s) 46 and may be configured to protect the antenna elements 3. Alternatively, the second portion 47 may be disposed around the antenna element 3 and the first portion 46. In some embodiments, the first portion(s) 46 and the second portion 47 may be formed integrally and concurrently as a monolithic structure or a one-piece structure. However, in some embodiments, the first portion(s) 46 and the second portion 47 may be physically separated from each other. As shown in FIG. 1, the first portion 31 (i.e., a radiation portion) may be exposed from the encapsulant 4 (e.g., the element including the first portion(s) 46 and the second portion 47).

The component 12 may be disposed on a portion of the first surface 21 of the carrier 2 exposed from the encapsulant 4. That is, the component 12 may be disposed on and electrically connected to the portion of the first surface 21 of the carrier 2 that is not covered by the encapsulant 4. Thus, the component 12 and the encapsulant 4 may be disposed on the first surface 21 of the carrier 2 side by side, and there may be a gap between the component 12 and the encapsulant 4. The component 12 may be a connector that is configured to connect the carrier 2 to an external device.

The electronic device 15 (e.g., a semiconductor die) may be disposed on and electrically connected to the second surface 22 of the carrier 2, and may be configured to electrically connect the antenna elements 3 through the carrier 2. The package body 16 (e.g., a molding compound with or without fillers) may cover at least a portion of the second surface 22 of the carrier 2 and encapsulate the electronic device 15. A material of the package body 16 may be same as or different from a material of the encapsulant 4. In some embodiments, the package body 16 and the encapsulant 4 may be formed concurrently. In addition, the shielding layer 17 may cover the package body 16. The shielding layer 17 may be a plated metal layer that is used for EMI (electromagnetic interference) shielding. In some embodiments, the shielding layer 17 may further extend to cover and contact at least a portion of the first lateral surface 25a and the second lateral surface 25b of the carrier 2.

In the embodiment illustrated in FIG. 1 to FIG. 3, during a manufacturing process, the ends 33 of the antenna elements 3 may be bonded or attached to the carrier 2 temporarily through the adhesion material 5 in the opening 23. Then, the encapsulant 4 may be formed to cover the first surface 21 of the carrier 2 and encapsulate the antenna elements 3 by a molding process. Thus, the antenna elements 3 may stand on the carrier 2 securely and vertically. As a result, the antenna elements 3 may not tilt, and the antenna elements 3 may be substantially perpendicular to the first surface 21 of the carrier 2. The yield of the antenna device 1 is improved. Further, the antenna elements 3 may be mounted to the carrier 2 through a transfer molding process, so that a reconstitution process of the antenna elements 3 and a process of applying an underfill are omitted. Thus, the manufacturing cost is reduced, and the UPH (unit per hour) is increased. In addition, void issue and delamination issue caused by capillary underfill in a wide area between an antenna element and a carrier in a comparative embodiment is avoided.

Figure 4:
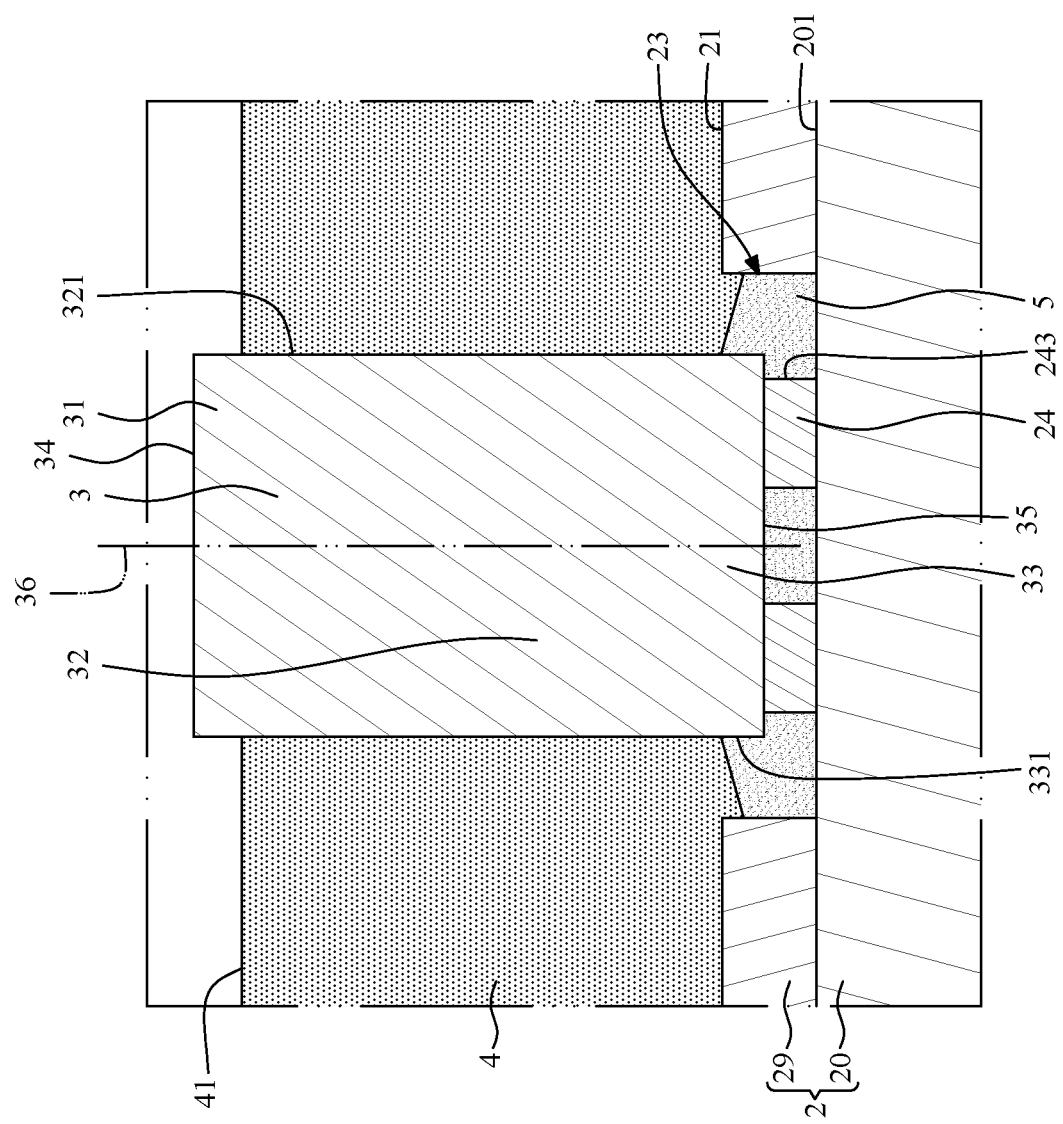
FIG. 4 illustrates an enlarged cross-sectional view of a portion of an antenna device according to some embodiments of the present disclosure.

FIG. 4 illustrates an enlarged cross-sectional view of a portion of an antenna device according to some embodiments of the present disclosure. The structure shown in FIG. 4 may be similar to the structure shown in FIG. 3, except that the second surface 35 of the antenna element 3 contacts the feeding pads 24 so that the antenna element 3 is electrically connected to the feeding pads 24.

Figure 5:
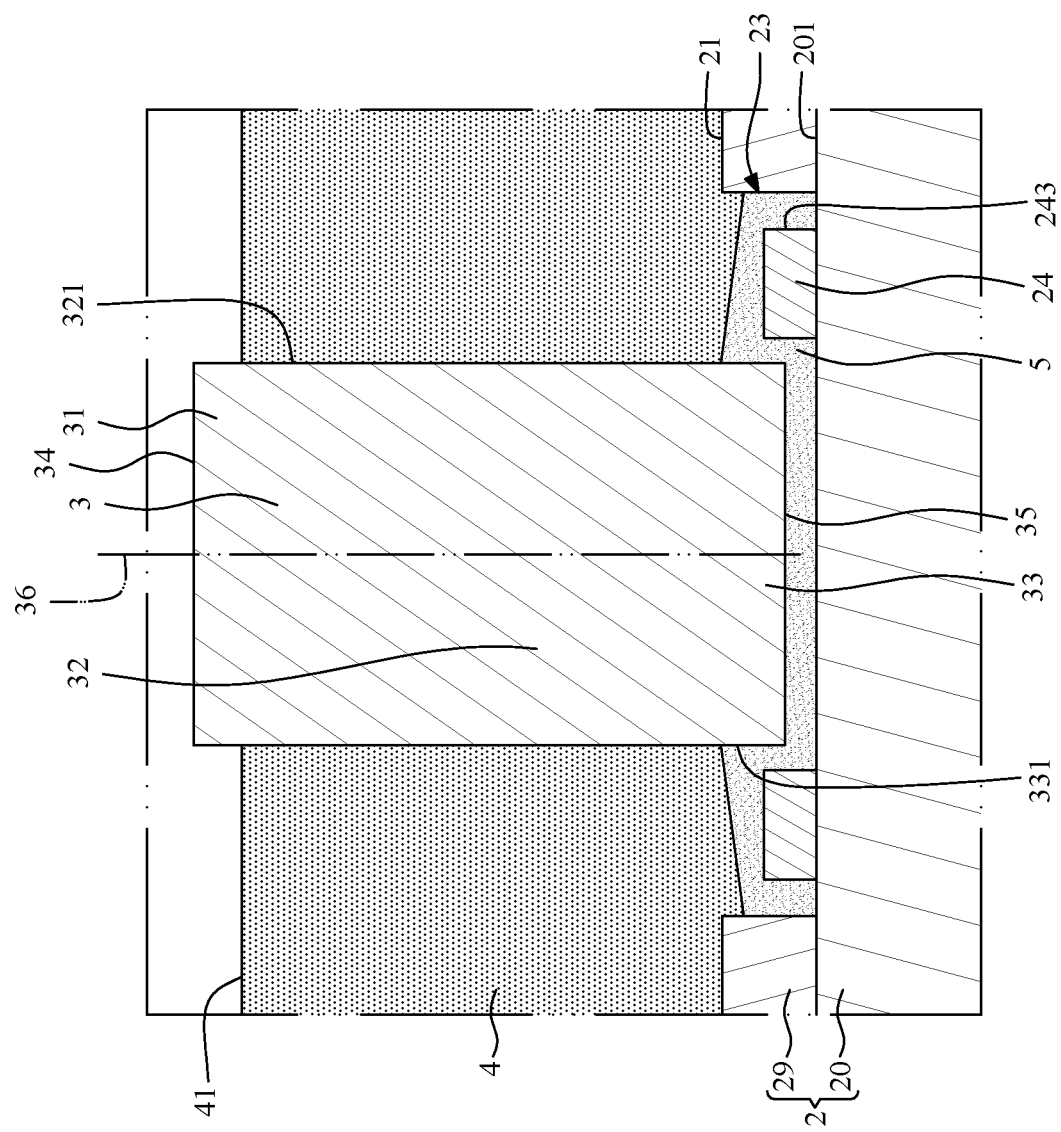
FIG. 5 illustrates an enlarged cross-sectional view of a portion of an antenna device according to some embodiments of the present disclosure.

FIG. 5 illustrates an enlarged cross-sectional view of a portion of an antenna device according to some embodiments of the present disclosure. The structure shown in FIG. 5 may be similar to the structure shown in FIG. 3, except that the width of the opening 23 of FIG. 5 may be greater than the width of the opening 23 of FIG. 3, and the antenna element 3 and the feeding pads 24 are disposed in the opening 23 side by side. That is, the feeding pads 24 are not disposed right under the antenna element 3. The feeding pads 24 may be disposed around the antenna element 3.

Figure 6:
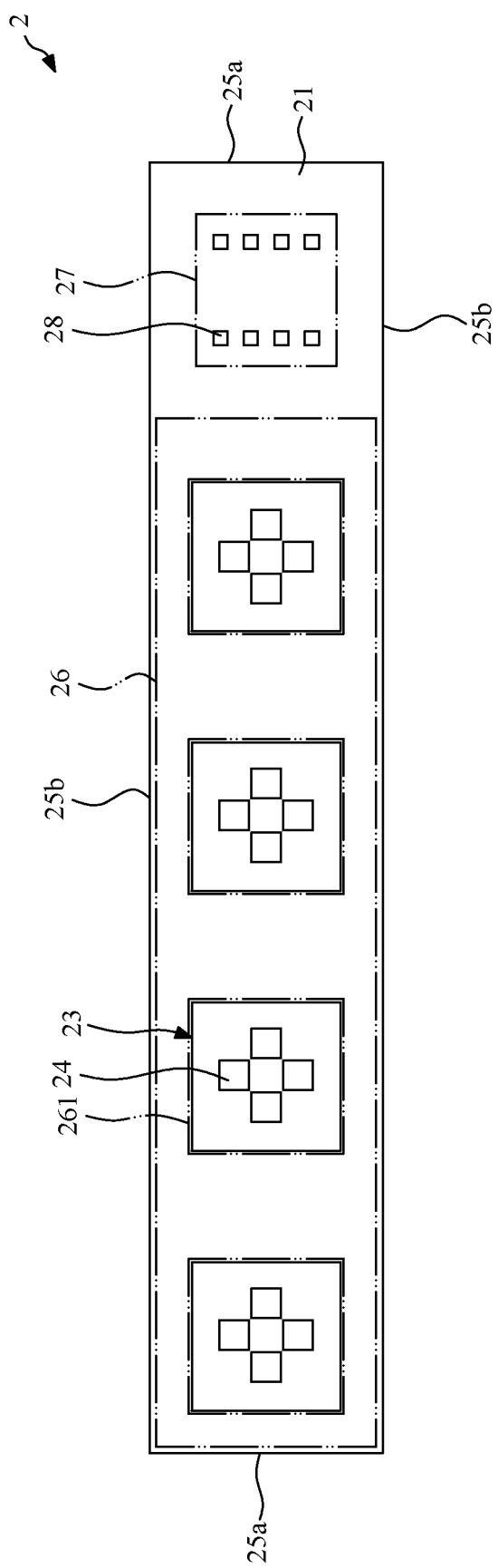
FIG. 6 illustrates a top view of the carrier of FIG. 1.

FIG. 6 illustrates a top view of the carrier 2 of FIG. 1. The carrier 2 may define a first area 26, a plurality of second areas 261 and a third area 27. The second areas 261 are located in the first area 26. The third area 27 is located outside the first area 26. The encapsulant 4 (or the element including the first portion(s) 46 and the second portion 47) of FIG. 1 and FIG. 2 is disposed on the first area 26. Thus, the third area 27 is exposed from the second portion 47. Each of the antenna elements 3 of FIG. 1 and FIG. 2 is disposed on a respective one of the second areas 261. The component 12 of FIG. 1 and FIG. 2 is disposed on the third area 27.

The size and location of the second areas 261 may correspond to the openings 23 of the carrier 2. Thus, the feeding pads 24 are disposed and exposed in the second areas 261. In addition, the carrier 2 may further include a plurality of conductive pads 28 disposed and exposed in the third area 27. The component 12 of FIG. 1 and FIG. 2 is electrically connected to the conductive pads 28.

Figure 7:
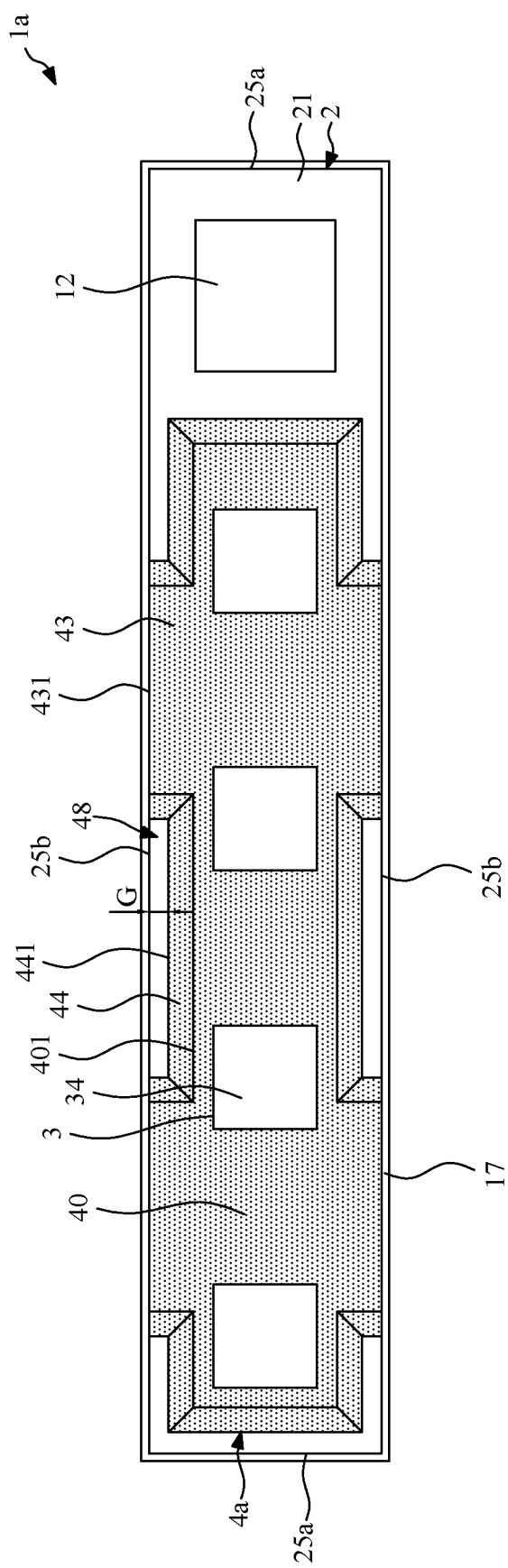
FIG. 7 illustrates a top view of an antenna device according to some embodiments of the present disclosure.

FIG. 7 illustrates a top view of an antenna device 1a according to some embodiments of the present disclosure. The antenna device 1a of FIG. 7 is similar to the antenna device 1 of FIG. 2, except that a structure of the encapsulant 4a. As shown in FIG. 2, the encapsulant 4 extend to three sides of the carrier 2, thus, three first lateral surfaces 45 of the encapsulant 4 may be substantially aligned with or coplanar with one first lateral surface 25a and two lateral surfaces 25b of the carrier 2. As shown in FIG. 7, the encapsulant 4a may include a main portion 40, at least one first portion 43 and at least one second lateral surface 44. The first portion 43 and the second lateral surface 44 surround the main portion 40. The first portion 43 extends from the main portion 40 to reach a side of the carrier 2, thus, the first portion 43 of the encapsulant 4a has a lateral surface 431 that is substantially coplanar with the second lateral surface 25b of the carrier 2. A thickness of the first portion 43 may be equal to a thickness of the main portion 40. Further, the second lateral surface 44 may be disposed between two first portions 43. The second lateral surface 44 extends from the main portion 40 but does not reach a side of the carrier 2. Thus, there is a gap G between an edge 441 of the second lateral surface 44 of the encapsulant 4a on the carrier 2 and the second lateral surface 25b of the carrier 2. There may be a recess 48 (or a notch) defined by the first portion 43 and the second portion 44. A thickness of the second portion 44 decreases from the main portion 40 toward the edge 441. There may be an inclination angle between a top surface of the second portion 44 and a top surface of the main portion 40. That is, the top surface of the second portion 44 and the top surface of the main portion 40 are not at the same plane, and an edge 401 is formed between the top surface of the second portion 44 and the top surface of the main portion 40.

During a manufacturing process, the first portions 43 of the encapsulants 4a on different carrier units of a strip are connected with each other after a molding process. In a singulation stage, a cutting tool is used cut the strip to singulate the carrier 2 and the encapsulant 4a. Because the design of the recess 48, only the first portions 43 of the encapsulants 4a are cut with the strip. That is, the amount of the encapsulant 4a to be cut by the cutting tool is reduced. As a result, the life of the cutting tool is improved.

Figure 8:
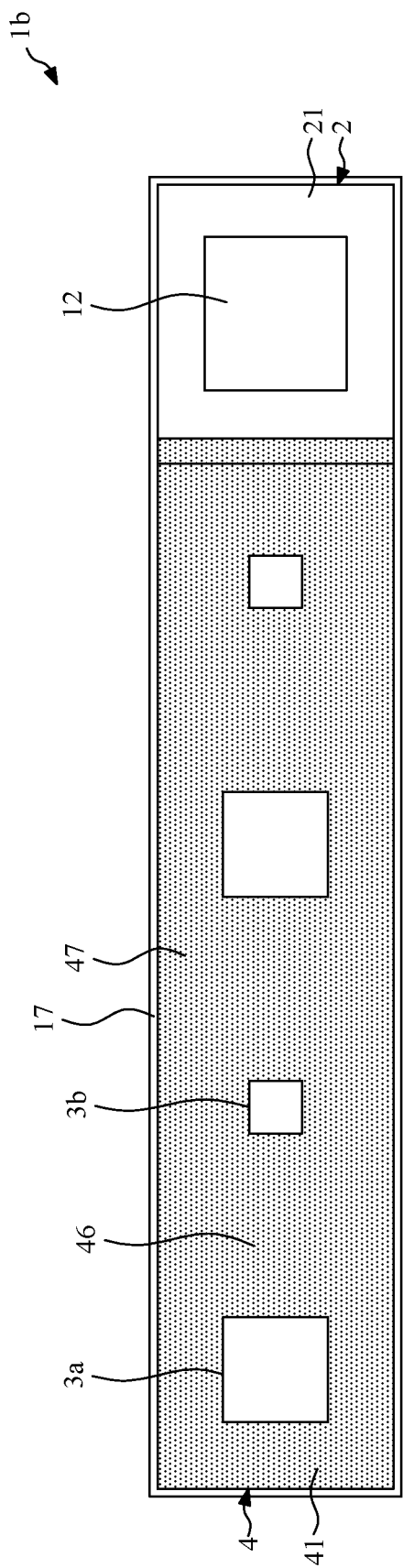
FIG. 8 illustrates a top view of an antenna device according to some embodiments of the present disclosure.

FIG. 8 illustrates a top view of an antenna device 1b according to some embodiments of the present disclosure. The antenna device 1b of FIG. 8 is similar to the antenna device 1 of FIG. 2, except that the antenna elements 3a, 3b have different sizes. Alternatively, at least two of the antenna elements 3a, 3b have different projection areas on the carrier 2. As shown in FIG. 8, the antenna elements 3a, 3b may include at least one first antenna element 3a and at least one second antenna element 3b. A size of the first antenna element 3a is greater than a size of the second antenna element 3b, and a frequency of a signal radiated by the first antenna element 3a is lower than a frequency of a signal radiated by the second antenna element 3b. Alternatively, a projection area of the first antenna element 3a on the carrier 2 is greater than a projection area of the second antenna element 3b on the carrier 2.

FIG. 9 through FIG. 14 illustrate a method for manufacturing an antenna device according to some embodiments of the present disclosure. In some embodiments, the method is for manufacturing the antenna device 1 shown in FIG. 1 to FIG. 3.

Figure 9:
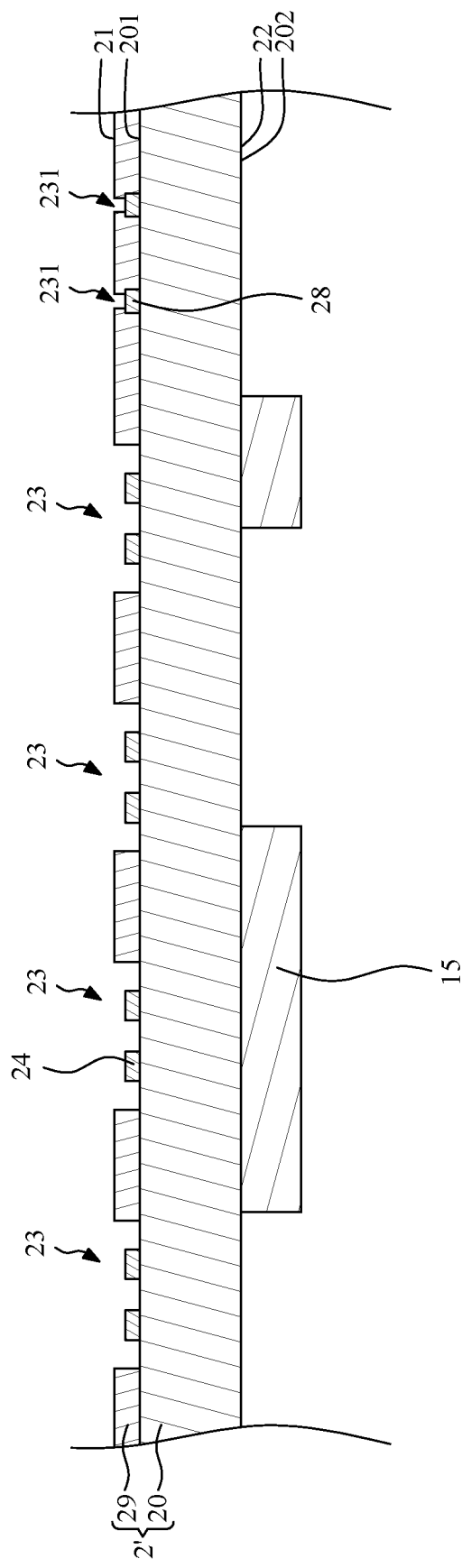
FIG. 9 illustrates one or more stages of an example of a method for manufacturing an antenna device according to some embodiments of the present disclosure.

Referring to FIG. 9, a carrier 2 is provided. The carrier 2' of FIG. 9 may be similar to the carrier 2 of FIG. 1. The carrier 2' of FIG. 9 may be in a strip type and may include a plurality of carriers 2 of FIG. 1. The carrier 2' may have a first surface 21 and a second surface 22 opposite to the first surface 21. The carrier 2' may include a main body 20, a plurality of feeding pads 24, a plurality of conductive pads 28 and a protection layer 29. The feeding pads 24 and the conductive pads 28 may be disposed adjacent to a first surface 201 of the main body 20 or disposed adjacent to the first surface 21 of the carrier 2'. The protection layer 29 may be disposed on the first surface 201 of the main body 20. In some embodiments, a plurality of openings 23 may be formed in the protection layer 29 of the carrier 2' to expose the feeding pads 24. In addition, a plurality of openings 231 may be formed in the protection layer 29 of the carrier 2' to expose the conductive pads 28. Then, at least one electronic device 15 (e.g., a semiconductor die and/or a passive component) may be disposed on and electrically connected to the second surface 22 of the carrier 2'.

Figure 10:
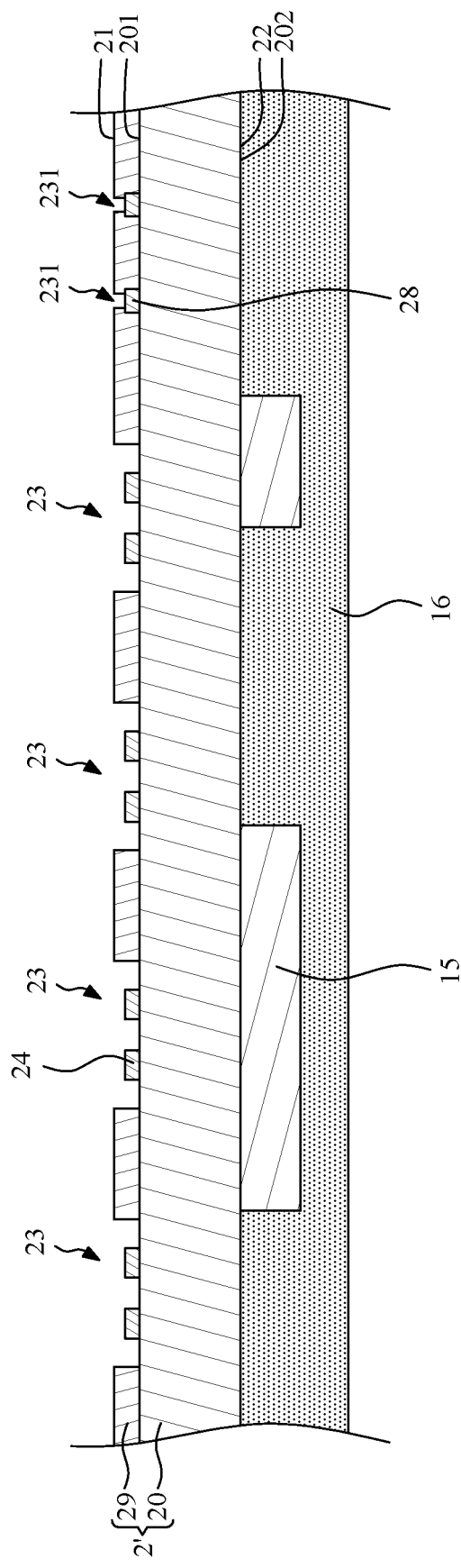
FIG. 10 illustrates one or more stages of an example of a method for manufacturing an antenna device according to some embodiments of the present disclosure.

Referring to FIG. 10, a package body 16 (e.g., a molding compound with or without fillers) is form or disposed on the second surface 22 of the carrier 2' to encapsulate the electronic device 15.

Figure 11:
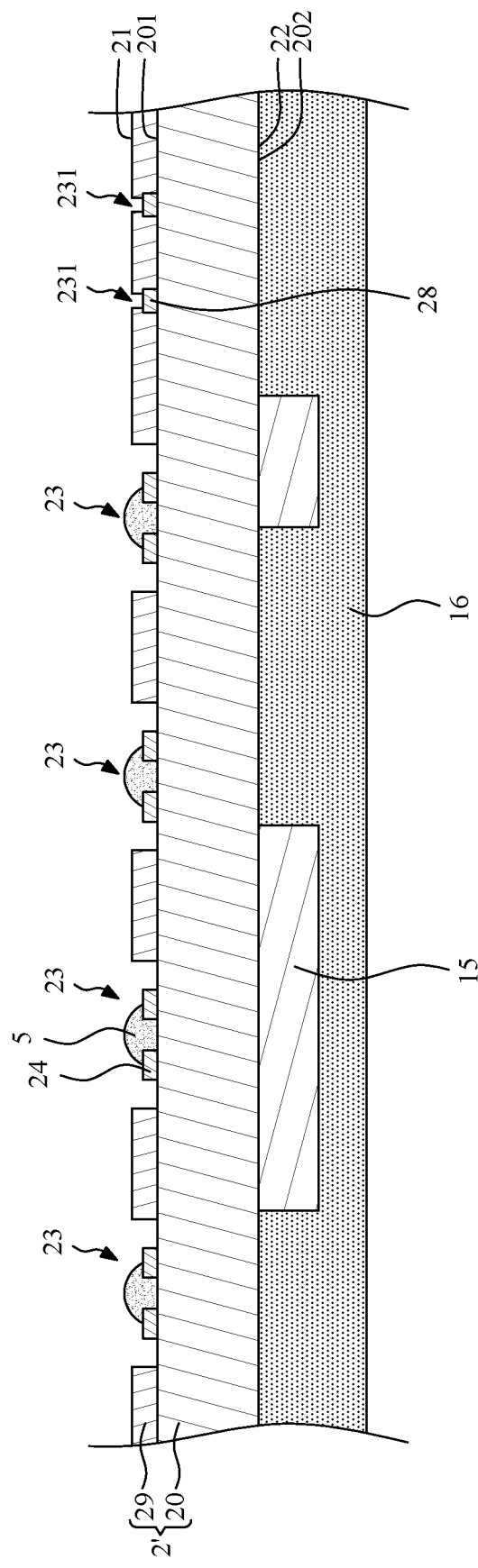
FIG. 11 illustrates one or more stages of an example of a method for manufacturing an antenna device according to some embodiments of the present disclosure.

Referring to FIG. 11, an adhesion material 5 is applied or disposed in the opening 23 of the protection layer 29 of the carrier 2'. In some embodiments, the adhesion material 5 may be disposed in the space between the feeding pads 24 and cover a portion of the top surface of the feeding pad 24. In some embodiments, the adhesion material 5 may not extend to the gap or space between the feeding pads 24 and the sidewall of the opening 23 of the protection layer 29 of the carrier 2'.

Figure 12:
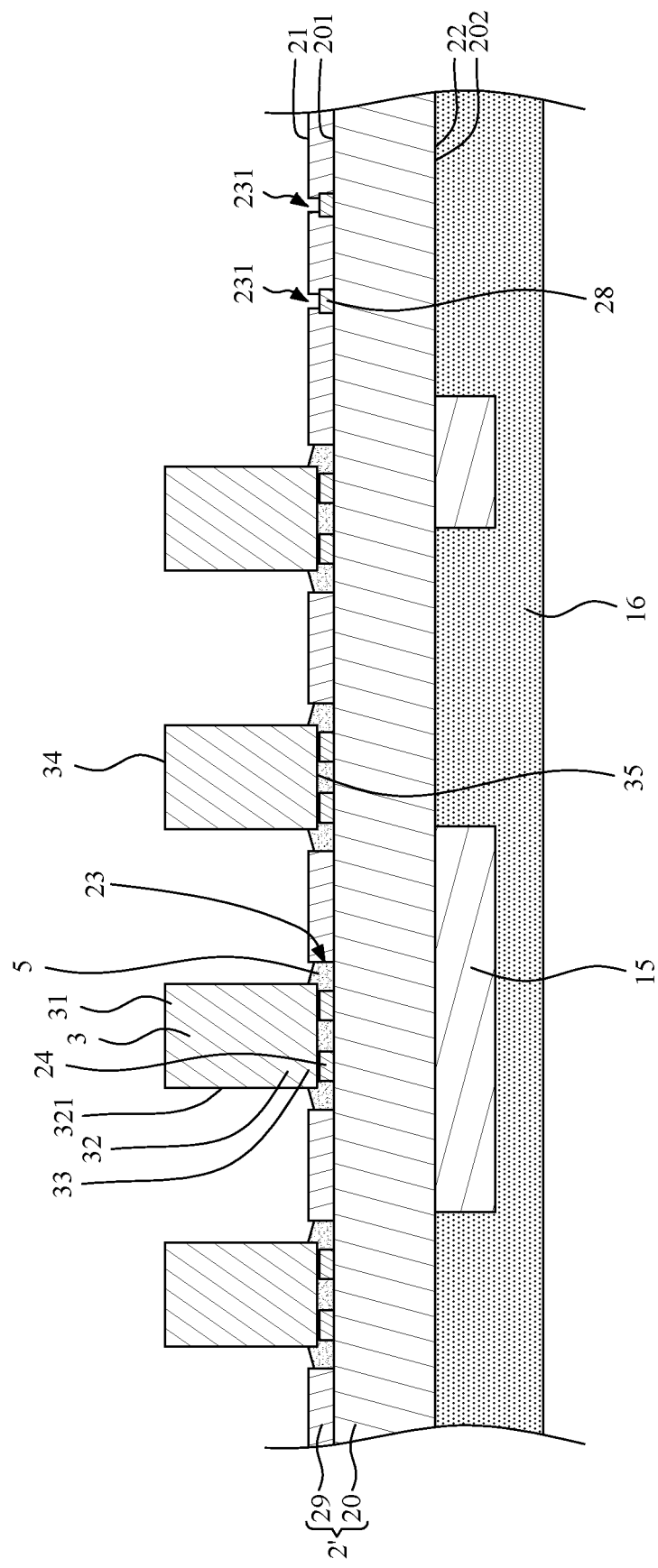
FIG. 12 illustrates one or more stages of an example of a method for manufacturing an antenna device according to some embodiments of the present disclosure.

Referring to FIG. 12, a plurality of antenna elements 3 are disposed on the carrier 2' by, for example, pick and press process. The antenna elements 3 of FIG. 12 may be same as or similar to the antenna elements 3 of FIG. 1. In some embodiments, one end 33 of at least one of the antenna elements 3 is disposed in a respective one of the openings 23 of the carrier 2'. The at least one of the antenna elements 3 may be configured to electrically connect to the feeding pad 24 exposed from the opening 23. The antenna elements 3 may be bonded to the first surface 21 of the carrier 2' or the first surface 201 of the main body 20 of the carrier 2' through the adhesion material 5. In some embodiments, the antenna element 3 may be pushed to the adhesion material 5 by a downward pressing force. Thus, a portion of the adhesion material 5 may be extruded to extend into the gap or space between the feeding pads 24 and the sidewall of the opening 23 of the protection layer 29 of the carrier 2', and there may be no void formed between the end 33 of the antenna element 3 and the adhesion material 5.

The antenna element 3 may have a first surface 34 and a second surface 35 opposite to the first surface 34. An elevation of the second surface 35 of the antenna element 3 may be lower than an elevation of the first surface 21 of the carrier 2'. The feeding pads 24 are disposed right under the antenna element 3. In some embodiments, the end 33 of the antenna element 3 does not contact the feeding pads 24. The end 33 of the antenna element 3 is spaced apart from the feeding pads 24. Thus, the second surface 35 of the antenna element 3 faces the feeding pads 24, and there is a gap between the second surface 35 of the antenna element 3 and a top surface of the feeding pad 24.

Figure 13:
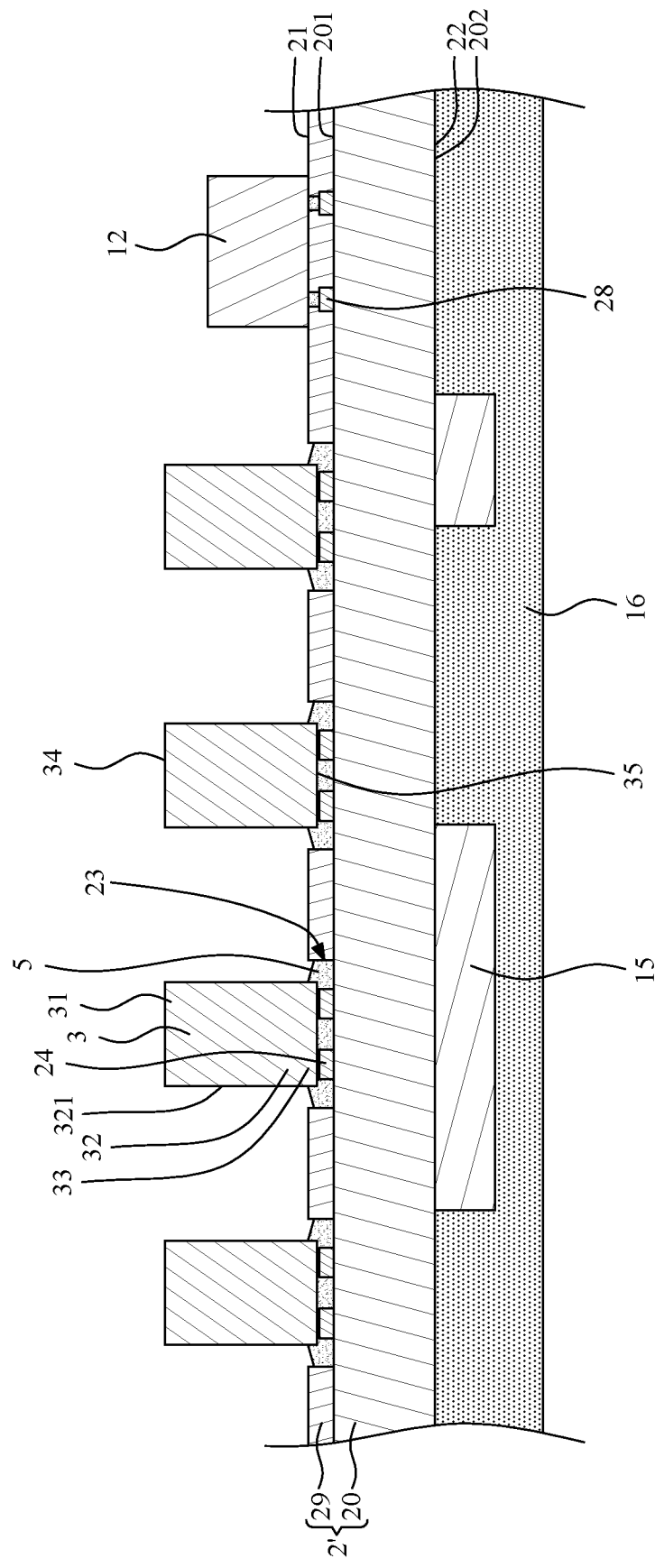
FIG. 13 illustrates one or more stages of an example of a method for manufacturing an antenna device according to some embodiments of the present disclosure.

Referring to FIG. 13, a component 12 is disposed on the first surface 21 of the carrier 2' to electrically connect the conductive pads 28 by, for example, surface mounting technology (SMT).

Figure 14:
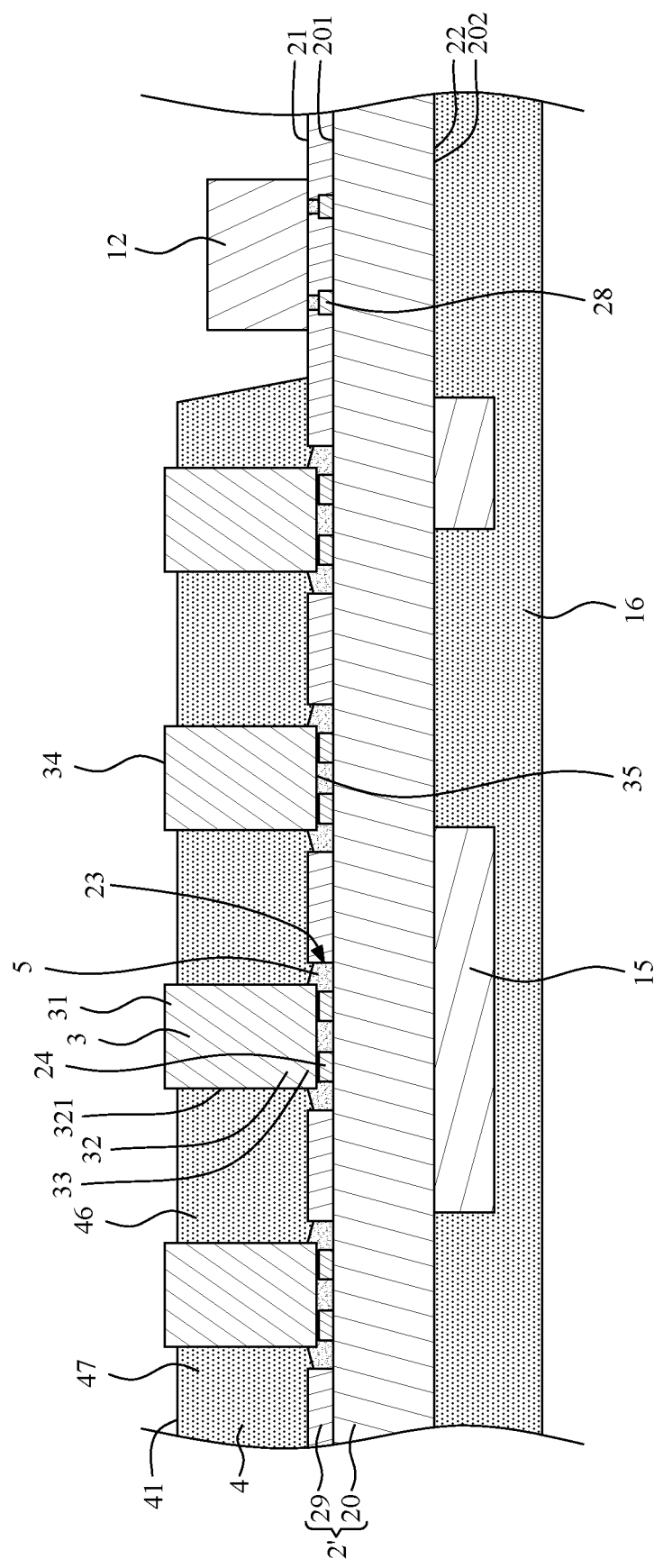
FIG. 14 illustrates one or more stages of an example of a method for manufacturing an antenna device according to some embodiments of the present disclosure.

Referring to FIG. 14, an encapsulant 4 (e.g., a molding compound with or without fillers) is formed on the first surface 21 of the carrier 2' by, for example, selective molding, to encapsulate the antenna elements 3 and to support the antenna elements 3 on the carrier 2'. In some embodiments, the encapsulant 4 may extend into the openings 23 of the protection layer 29 of the carrier 2'. During the molding process, the first portion 31 and the first surface 34 of the antenna element 3 may be pressed by a plastic film that is on an inner surface of a mold. Thus, when the encapsulant 4 flows in the mold cavity, the antenna elements 3 will not tilt. After the molding process, the encapsulant 4 may not cover the first surfaces 34 of the antenna elements 3, thus, the antenna elements 3 may be exposed from the first surface 41 of the encapsulant 4. For example, the first portion 31 of the antenna element 3 may protrude from the first surface 41 of the encapsulant 4, and may be exposed to air. In addition, the mold may need to define an accommodating space for accommodating the component 12 so as to protect the component 12 from being damaged by the mold. The encapsulant 4 may not enter the accommodating space to cover the component 12. In the embodiment, the mold is removed from the encapsulant 4 after the second portion 32 of the antenna element 3 is covered or encapsulated by the encapsulant 4, thus, the location and orientation of the antenna element 3 is fixed. Thus, the antenna elements 3 may stand on the carrier 2' securely and vertically. As a result, the antenna elements 3 may not tilt, and the antenna elements 3 may be substantially perpendicular to the first surface 21 of the carrier 2'. Further, the antenna elements 3 may be mounted to the carrier 2' through a transfer molding process, so that a reconstitution process of the antenna elements 3 and a process of applying an underfill are omitted. Thus, the manufacturing cost is reduced, and the UPH (unit per hour) is increased.

Then, a singulation process may be conducted to cut the encapsulant 4, the carrier 2' and the package body 16 so as to obtain a plurality of antenna devices 1 shown in FIG. 1.

Figure 15:
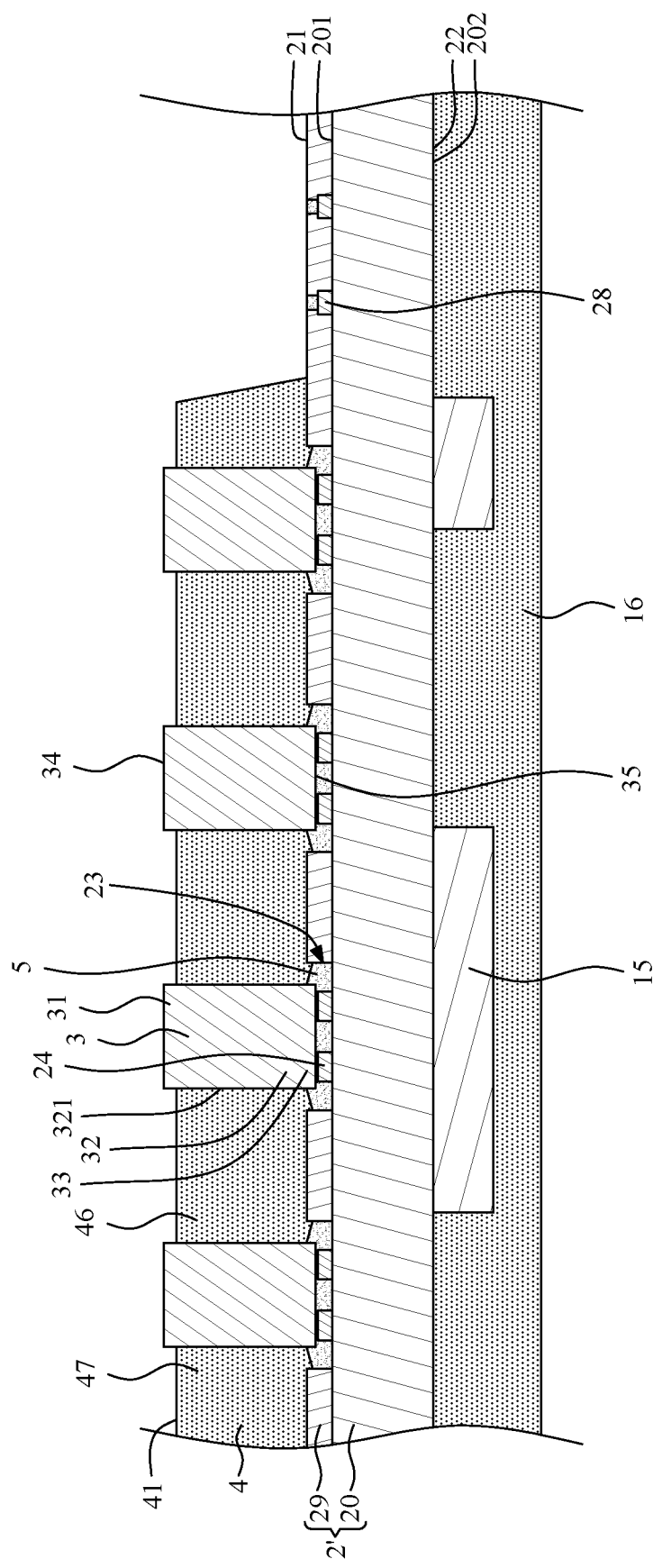
FIG. 15 illustrates one or more stages of an example of a method for manufacturing an antenna device according to some embodiments of the present disclosure.
Figure 16:
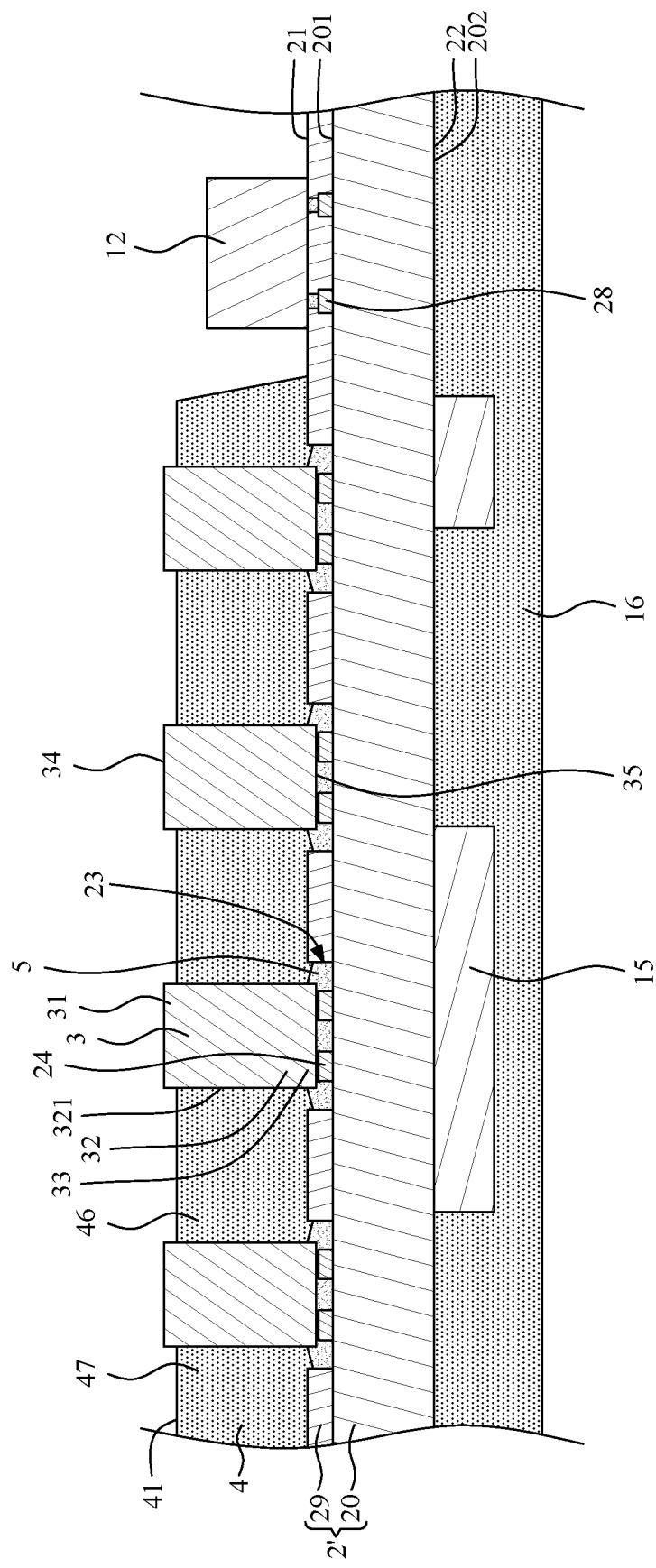
FIG. 16 illustrates one or more stages of an example of a method for manufacturing an antenna device according to some embodiments of the present disclosure.

FIG. 15 through FIG. 16 illustrates a method for manufacturing an antenna device according to some embodiments of the present disclosure, such as the antenna device 1 shown in FIG. 1. The initial stages of the illustrated process are the same as, or similar to, the stages illustrated in FIG. 9 to FIG. 12. FIG. 15 depicts a stage subsequent to that depicted in FIG. 12.

Referring to FIG. 15, an encapsulant 4 is formed on the first surface 21 of the carrier 2' by, for example, selective molding, to encapsulate the antenna elements 3. During the molding process, the first portion 31 and the first surface 34 of the antenna element 3 may be pressed by a plastic film that is on an inner surface of a mold. Thus, when the encapsulant 4 flows in the mold cavity, the antenna elements 3 will not tilt. After the molding process, the first surface 34 of the antenna element 3 and the first portion 31 of the antenna element 3 may protrude from the first surface 41 of the encapsulant 4, and may be exposed to air. In the illustrated embodiment, the mold may not need to define the accommodating space stated above since the component 12 is not disposed on the carrier 2' at this stage. It is noted that the encapsulant 4 may not cover the conductive pads 28.

Referring to FIG. 16, a component 12 is disposed on the first surface 21 of the carrier 2' to electrically connect the conductive pads 28 by, for example, surface mounting technology (SMT).

Then, a singulation process may be conducted to cut the encapsulant 4, the carrier 2' and the package body 16 so as to obtain a plurality of antenna devices 1 shown in FIG. 1.

Figure 17:
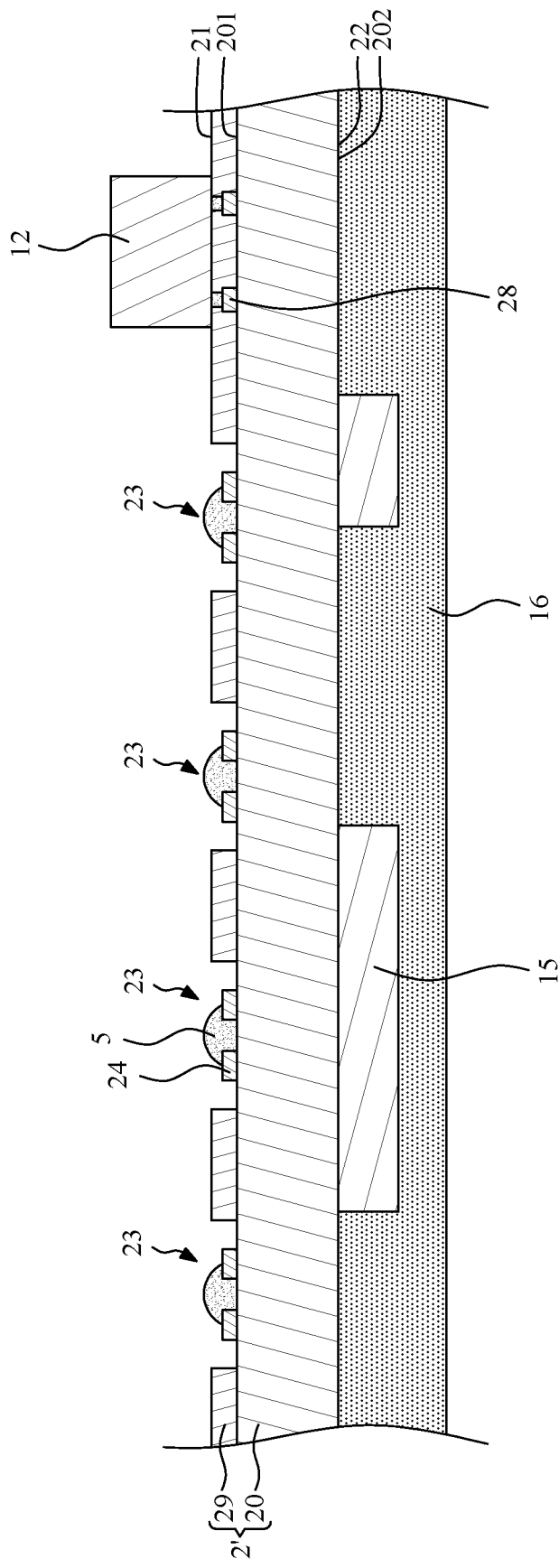
FIG. 17 illustrates one or more stages of an example of a method for manufacturing an antenna device according to some embodiments of the present disclosure.
Figure 18:
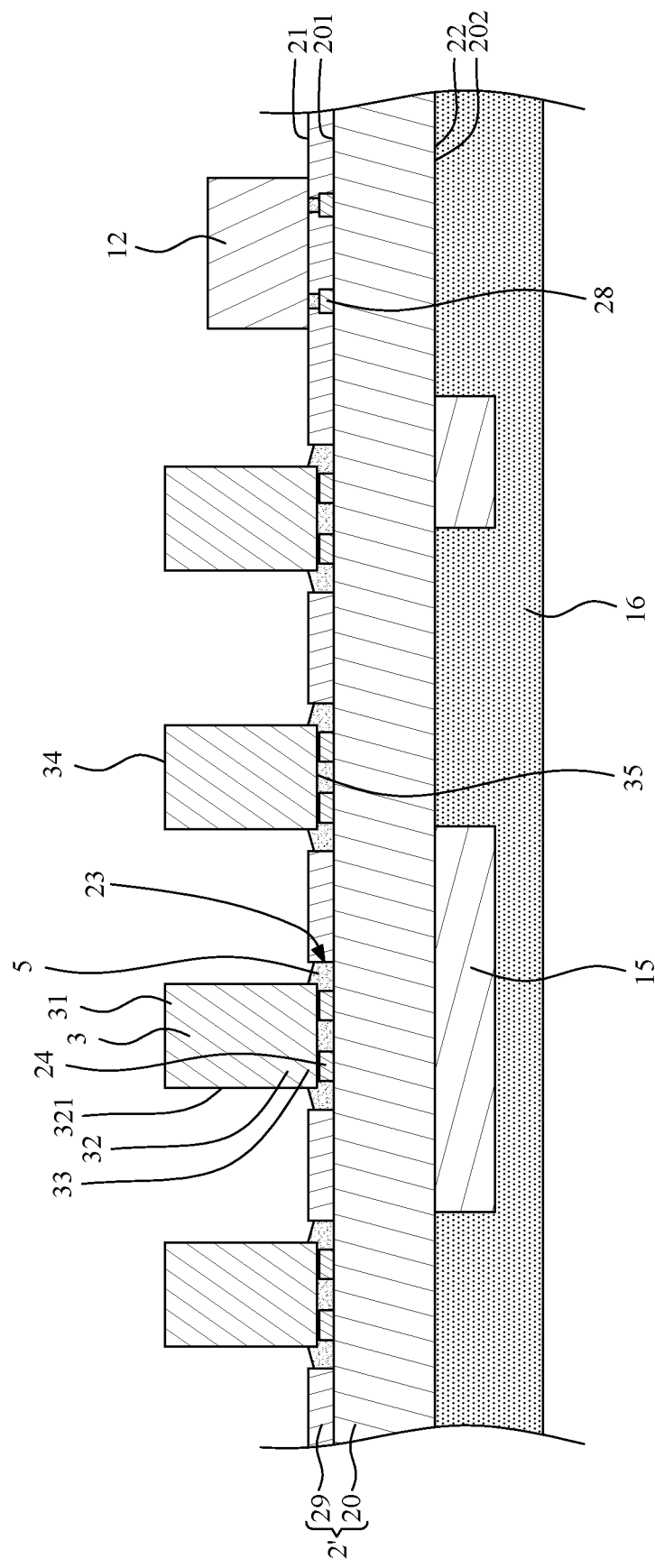
FIG. 18 illustrates one or more stages of an example of a method for manufacturing an antenna device according to some embodiments of the present disclosure.
Figure 19:
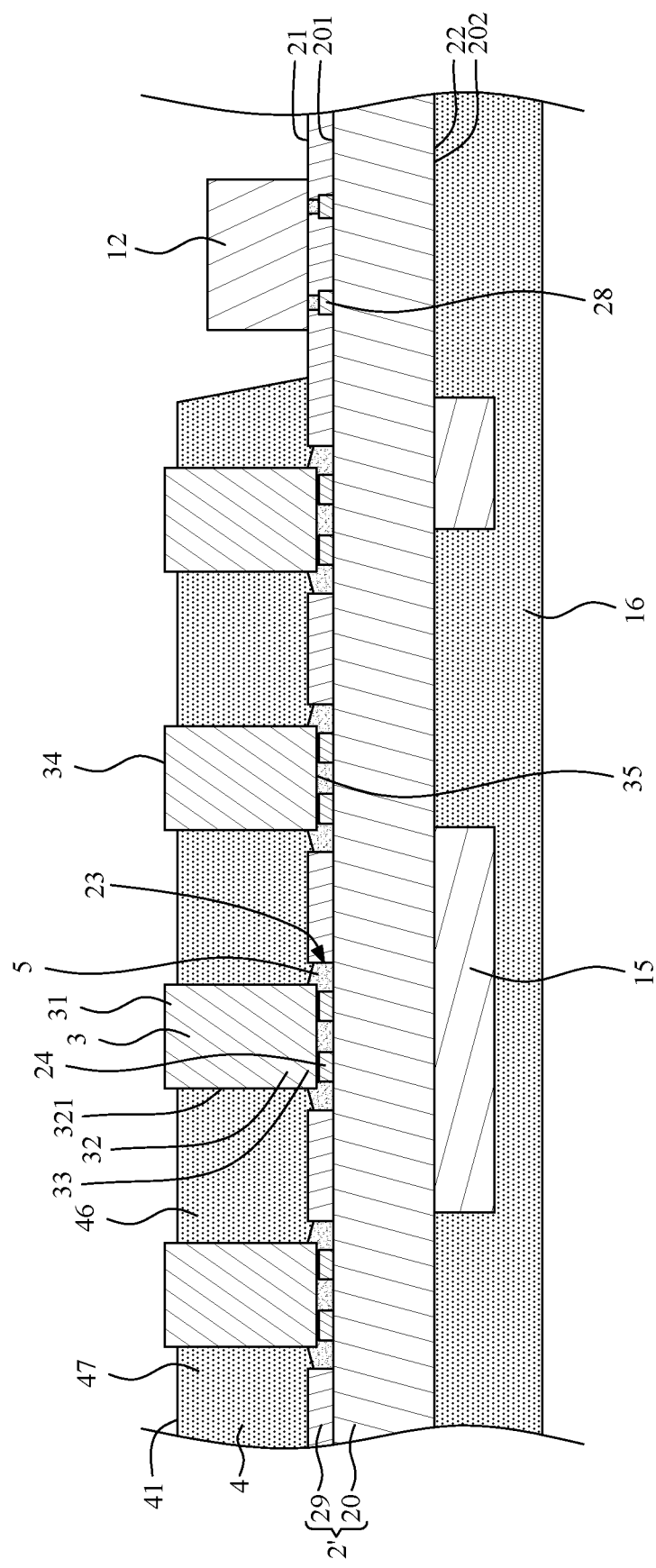
FIG. 19 illustrates one or more stages of an example of a method for manufacturing an antenna device according to some embodiments of the present disclosure.

FIG. 17 through FIG. 19 illustrates a method for manufacturing an antenna device according to some embodiments of the present disclosure, such as the antenna device 1 shown in FIG. 1. The initial stages of the illustrated process are the same as, or similar to, the stages illustrated in FIG. 9 to FIG. 11. FIG. 17 depicts a stage subsequent to that depicted in FIG. 11.

Referring to FIG. 17, a component 12 is disposed on the first surface 21 of the carrier 2' to electrically connect the conductive pads 28 by, for example, surface mounting technology (SMT).

Referring to FIG. 18, a plurality of antenna elements 3 are disposed on the carrier 2'. In some embodiments, one end 33 of at least one of the antenna elements 3 is disposed in a respective one of the openings 23. The antenna elements 3 may be bonded to the first surface 21 of the carrier 2' or the first surface 201 of the main body 20 of the carrier 2' through the adhesion material 5. The antenna element 3 may have a first surface 34 and a second surface 35 opposite to the first surface 34. An elevation of the second surface 35 of the antenna element 3 may be lower than an elevation of the first surface 21 of the carrier 2'.

Referring to FIG. 19, an encapsulant 4 is formed on the first surface 21 of the carrier 2' by, for example, selective molding, to encapsulate the antenna elements 3. During the molding process, the first portion 31 and the first surface 34 of the antenna element 3 may be pressed by a plastic film that is on an inner surface of a mold. Thus, when the encapsulant 4 flows in the mold cavity, the antenna elements 3 will not tilt. After the molding process, the encapsulant 4 may not cover the first surfaces 34 of the antenna elements 3, thus, the antenna elements 3 may be exposed from the first surface 41 of the encapsulant 4. For example, the first portion 31 of the antenna element 3 may protrude from the first surface 41 of the encapsulant 4, and may be exposed to air. In addition, the mold may need to define an accommodating space for accommodating the component 12 so as to protect the component 12 from being damaged by the mold. The encapsulant 4 may not enter the accommodating space to cover the component 12.

Then, a singulation process may be conducted to cut the encapsulant 4, the carrier 2' and the package body 16 so as to obtain a plurality of antenna devices 1 shown in FIG. 1.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An antenna device comprising:
    a carrier defining a first area and a plurality of second areas in the first area;
    a plurality of antenna elements disposed over the second areas; and
    an element including a first portion disposed over the first area and configured to support the antenna elements and a second portion disposed over the first area configured to protect the antenna elements, wherein the second portion is disposed around the antenna element and the first portion, and the first portion is disposed between adjacent two of the plurality of antenna elements and contacts the adjacent two of the plurality of antenna elements;
    wherein the second portion has a lateral surface that is substantially coplanar with a lateral surface of the carrier, and the second portion defines a recess recessed from the lateral surface of the second portion from a top view.

2. The antenna device of claim 1, wherein the recess defines an edge of the second portion of the element from the top view, and a thickness of the second portion decreases toward the edge.

3. The antenna device of claim 1, further comprising:
    at least one pad disposed in the second areas, wherein a portion of the element is disposed in a gap between one of the plurality of antenna elements and the at least one pad.

4. The antenna device of claim 1, wherein the second portion contacts at least two of the plurality of antenna elements.

* * * * *